United States Patent [19]

Eberspacher et al.

[11] Patent Number: 5,045,409

[45] Date of Patent: Sep. 3, 1991

[54] PROCESS FOR MAKING THIN FILM SOLAR CELL

[75] Inventors: Chris Eberspacher, Los Angeles; James H. Ermer, Burbank; Kim W. Mitchell, Granada Hill, all of Calif.

[73] Assignee: Atlantic Richfield Company, Los Angeles, Calif.

[21] Appl. No.: 273,616

[22] Filed: Nov. 17, 1988

Related U.S. Application Data

[63] Continuation of Ser. No. 126,057, Nov. 27, 1987, abandoned.

[51] Int. Cl.[5] .................... H01L 29/14; H01L 31/18; B05D 5/12
[52] U.S. Cl. .................... 428/620; 136/264; 136/265; 148/33; 423/508; 427/76; 437/5; 437/232
[58] Field of Search ............ 437/5, 232; 427/76; 136/264, 265; 357/61; 423/508; 428/620; 148/33

[56] References Cited

U.S. PATENT DOCUMENTS

| | | | |
|---|---|---|---|
| 3,793,069 | 2/1974 | Shimizu et al. | 427/76 |
| 4,335,266 | 6/1982 | Mickelsen et al. | 136/260 |
| 4,465,575 | 8/1984 | Love et al. | 204/192.26 |
| 4,581,108 | 4/1986 | Kapur et al. | 204/37.1 |
| 4,611,091 | 9/1986 | Choudary et al. | 136/260 |
| 4,612,411 | 9/1986 | Wieting et al. | 136/265 |

OTHER PUBLICATIONS

Final Report, SERI Contract No. XL-5-05036-1, Oct. 1987.

M. J. Carter et al., *Conference Record, 19th IEEE Photovoltaic Specialists Conf.*, May 1987, pp. 1275-1278.

*Primary Examiner*—Aaron Weisstuch
*Attorney, Agent, or Firm*—Nilsson, Robbins, Dalgarn, Berliner, Carson & Wurst

[57] ABSTRACT

A method of making group I-III-VI compound semiconductors such as copper indium diselenide for use in thin film heterojunction photovoltaic devices. A composite film of copper, indium, and possibly other group IIIA elements, is deposited upon a substrate. A separate film of selenium is deposited on the composite film. The substrate is then heated in a chamber in the presence of a gas containing hydrogen to form the compound semiconductor material.

10 Claims, 1 Drawing Sheet

PROCESS FOR MAKING THIN FILM SOLAR CELL

This is a continuation of co-pending application Ser. No. 07/126,057, filed on Nov. 27, 1987, now abandoned.

BACKGROUND OF THE INVENTION

The present invention relates to thin film heterojunction solar cells formed from group I-III-VI compound semiconductors such as copper indium diselenide and more particularly to an improved method for making such semiconducting thin films for use in such solar cells.

The background of copper indium diselenide (CIS) cadmium sulfide solar cells is discussed in considerable detail in U.S. Pat. No. 4,335,266, issued to Mickelsen et al on June 15, 1982, which patent is hereby incorporated by reference for all purposes. As generally discussed in this reference, this type of device is considered by many to be a viable solar cell. Numerous improvements in efficiency of such solar cells are well documented by publications and patents covering such improvements.

U.S. Pat. No. 4,611,091, issued to Choudary et al on Sept. 9, 1986, covers one such improvement. This patent is hereby incorporated by reference for its teaching of a structure in which a majority of the cadmium sulfide layer used by Mickelsen is replaced by a substantially conducting wide bandgap n-type semiconductor material such as zinc oxide.

U.S. Pat. No. 4,581,108, issued to Kapur et al on Apr. 8, 1986, is hereby incorporated by reference for its teachings concerning an improved method for forming CIS for use in Mickelsen-type solar cells. In this patent, layers of copper and indium are sequentially deposited on a substrate by electrodeposition. This process allows very close control of the total quantities of these two elements. This patent teaches two alternative methods for formation of CIS. The preferred teaching involves heating of the substrate with copper and indium films at 400 degrees Centigrade in the presence of a selenium-containing gas, preferably $H_2Se$. The second method taught is to electrodeposit a separate film of elemental selenium on top of the copper and indium film and then heat the substrate at 400 degrees Centigrade in an inert atmosphere.

The heating of copper and indium films in the presence of a selenium-containing gas has been called selenization. This selenization process has been accepted by a number of researchers in the field as an effective way for forming good quality CIS films for use in the manufacture of heterojunction solar cells. However, a serious problem with the selenization process has been recognized. Hydrogen selenide, $H_2Se$, is an extremely toxic gas. It is considerably more toxic than the more commonly encountered gas hydrogen sulfide, $H_2S$, which is considered to be quite toxic. Large scale production of CIS-type semiconductor material using the selenization process would necessarily involve the manufacture, storage, and use of large quantities of the $H_2Se$ gas. This would present a risk of injury or death in the event of an accidental release of the material.

Therefore, research has been conducted on methods of selenization which minimize or eliminate entirely the use of $H_2Se$. For example, the use of a solid film of elemental selenium as suggested by Kapur et al does result in production of useful CIS films. However, the quality of such films has been found to be generally inferior to those produced by the preferred selenization process of Kapur et al.

SUMMARY OF THE INVENTION

Accordingly, an object of the present invention is to provide improved methods for formation of group I-III-VI semiconducting films such as copper indium diselenide while reducing or eliminating the use of $H_2Se$.

According to the present invention, the formation of a CIS film includes the separate depositions of the materials copper, indium, and selenium onto a substrate. The copper and indium are deposited first and in a preferred embodiment are believed to form a composite film. If desired, other group IIIA elements may be substituted for part of the indium in the composite film. A separate film of elemental selenium is then deposited upon the copper and indium. A semiconducting film is formed by heating the deposited films in the presence of a gas containing hydrogen. If desired, the hydrogen containing gas may also include selenium or sulfur.

DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
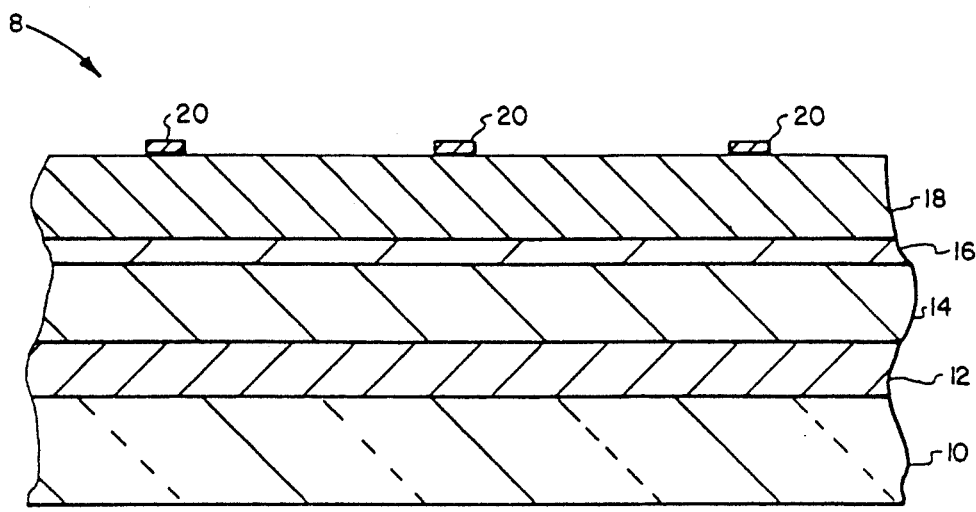
FIG. 1 is a cross-sectional view, not to scale, of a portion of a typical thin film solar cell according to the present invention.

With reference to FIG. 1 there is illustrated a portion of a solar cell 8 corresponding to that described in the above-referenced U.S. Pat. No. 4,611,091. This is the preferred structure for the present invention and is the structure used in building the example devices described below. Cell 8 is structurally supported on a glass substrate 10 which is about one to four millimeters thick. A back electric contact comprises a metal layer 12 deposited on substrate 10. Layer 12 in the preferred embodiment is molybdenum having a thickness of about 0.2 to two microns. The first active region of device 8 comprises a semiconductor layer 14 which in the preferred embodiment is p-type CIS having a thickness of about one to three microns. The manufacture of layer 14 is described in more detail below. A thin layer 16 of n-type semiconductor material comprising cadmium sulfide is positioned on layer 14. Layer 16 has a thickness of less than 2500 angstroms and in the preferred embodiment has a thickness of about 100 Å to about 500 Å and preferably from about 300 521 to about 350 Å. A layer 18 of conducting wide band gap n-type semiconductor material is positioned on layer 16. In the preferred embodiment, layer 18 is formed primarily of zinc oxide and has a thickness of from 0.1 to three microns. The device 8 is completed by a series of front face contacts 20 in the form of narrow metal strips which may be, for example, aluminum deposited by sputtering, evaporation, or plating. In some device designs contacts 20 are omitted.

Figure 2:
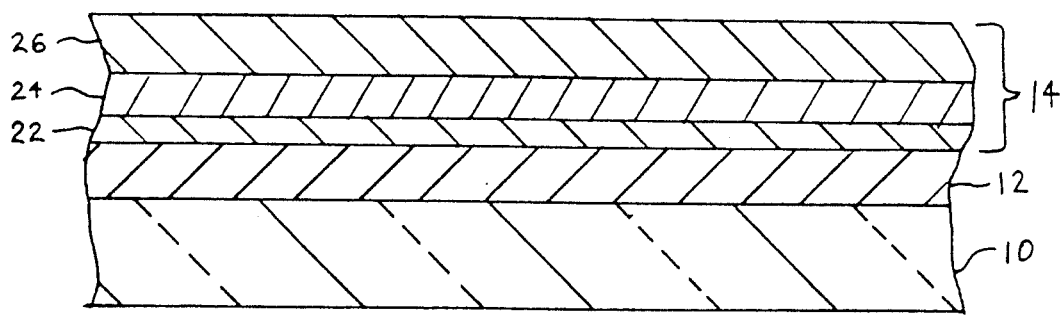
FIG. 2 is a cross-sectional view of a portion of a substrate at an intermediate stage of manufacture.

With reference to FIG. 2 there is illustrated the device 8 of FIG. 1 at an intermediate stage of manufacture. At this stage the substrate 10 has deposited thereon the back contact film 12 and three additional layers of material which will form the CIS film 14. In the preferred embodiment these films include a film of copper 22, a film of indium 24, and a film of selenium 26. In this preferred form the copper film 22 is about 2000 angstroms thick, the indium film 24 is about 4000 angstroms thick, and the selenium film 26 is about 9200 angstroms thick. These thicknesses provide a copper-to-indium atomic ratio of about one, which is generally accepted as desirable for formation of CIS films. The selenium film provides an excess of selenium relative to the copper and indium materials. These preferred thicknesses result in a final CIS film thickness of about two microns. For other desired CIS film thicknesses the specified initial elemental film thicknesses would be proportionally adjusted.

Figure 3:
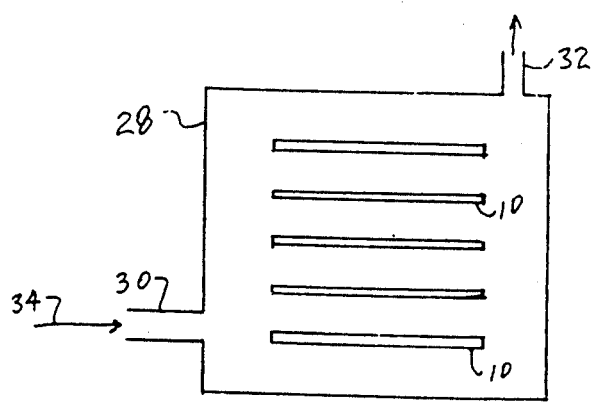
FIG. 3 is a schematic illustration of a furnace in which heating is performed according to the present invention.

With reference to FIG. 3 there is illustrated the basic furnace arrangement used in the present invention. The basic furnace 28 is simply a closed heating chamber having a gas inlet 30 and outlet 32. While in the preferred embodiment the furnace is operated at approximately atmospheric pressure, appropriate seals and safety mechanisms are provided to avoid accidental release of gases since some are toxic. For example, exhaust vent 32 leads to appropriate gas burners and scrubbers to remove all toxic material before venting to the atmosphere. Substrates 10 are shown positioned in the furnace where they are heated in the presence of a gas fed in through inlet 30 as indicated by the arrow 34.

Various methods are known for depositing copper and indium films 22 and 24 as illustrated in FIG. 2. For example, various researchers have used electrodeposition and evaporation to deposit these films. However, in the preferred embodiment we have used magnetron sputtering to deposit films 22 and 24. U.S. Pat. No. 4,465,575, issued to Love et al on Aug. 14, 1984, is hereby incorporated by reference for its teachings of magnetron sputtering for the formation of CIS films. In the preferred embodiment the films 22 and 24 are deposited from physically distinct magnetron sputtering heads instead of being co-deposited as taught by Love et al. This process provides totally independent control of the thicknesses of films 22 and 24 and, therefore, gives ratio control similar to that provided by the plating technique taught by Kapur et al. We also believe that the magnetron sputtering technique provides an additional advantage. We have found that magnetron sputtering of indium onto a copper film results in instantaneous alloying or mixing of the copper and indium materials. Thus, while films 22 and 24 are shown as distinct films, the preferred deposition technique actually results in a composite film of copper and indium. For control purposes the indium film can be considered deposited as a separate film since it is not actually co-deposited with copper and the quantity deposited can be determined by measurement of total film thickness or by measurement of indium film thickness on a separate sample having no copper film. For purposes of the present invention, the term "composite film of copper and indium" is intended to mean either the separate copper and indium films 22 and 24 as illustrated in FIG. 2 or any form of those films including a totally alloyed combination of the films 22 and 24 which we believe results from the preferred deposition technique.

In the preferred embodiment, selenium film 26 is deposited by a conventional thermal evaporation method. The source is an in-line source which evaporates down onto substrates as they move on a conveyor. Other deposition equipment and methods as are generally known to those skilled in the art, such as electron beam evaporation or sputtering, may be used if desired.

After deposition of the materials, as illustrated in FIG. 2, the substrate 10 is placed in the furnace 28 for formation of the final CIS semiconductor material. As discussed by Kapur et al, as an alternative selenization process, CIS may be formed simply by heating the substrates 10 in the presence of an inert gas. We have found that heating of the substrate to temperatures from 350° C. to 550° C. and preferably about 400° C. to about 420° C. in the presence of argon for a period of one-half to two hours results in formation of useful CIS material. To avoid thermal shock effects the substrates should normally be ramped up to, and down from, the peak temperature at a controlled rate. In a preferred form, the substrate is held at about 200° C. to about 300° C., preferably about 250° C., for a short time, e.g. about fifteen minutes, on the ramp up part of the cycle. Unless otherwise specified, this type of heating cycle was used in each of the processes discussed herein. When a photovoltaic structure such as that shown in FIG. 1 is completed according to the teaching of Choudary et al, a reasonably efficient photovoltaic device is produced.

However, in efforts to improve the quality of the CIS film, we found that a low concentration of $H_2Se$ in the furnace resulted in improved device quality. While selenization performed without a solid film of selenium, such as film 26, FIG. 2, requires relatively high concentration of $H_2Se$, for example twelve percent by volume diluted in an inert gas, we have found that a concentration of about two percent by volume diluted in nitrogen provides improved quality semiconducting films when the film 26 is used. When a film made by this method was used to form a completed one by four centimeter device according to FIG. 1, a photovoltaic efficiency of about twelve percent was achieved. This greatly improves the safety aspect of the selenization process by reducing the quantity of $H_2Se$ which must be stored and used.

In an effort to totally eliminate the need to store and use $H_2Se$, substrates, as illustrated in FIG. 2, were heated in the presence of a gas containing hydrogen. In these experiments a commercially available gas known as forming gas, which is a mixture of hydrogen and nitrogen, was used in furnace 28. This gas is about 3.5 to four percent hydrogen by volume with the balance being nitrogen. Mixtures of hydrogen diluted in other inert gases, for example argon, helium, etc., should also be useful in this process. Surprisingly, the resulting CIS films were of improved quality on the order of that achieved when $H_2Se$ is used in furnace 28. When these films were used to form completed devices according to FIG. 1, efficiencies on the order of eleven percent were achieved.

We have also found that other hydrogen containing gases provide improved quality CIS films. Substrates, according to FIG. 2, have been heated in the furnace 28 in the presence of gas comprising from two to twelve percent $H_2S$, by volume in nitrogen. This process also resulted in production of improved CIS material. This material is somewhat different from the classical copper indium diselenide since it is believed to contain some sulfur as a result of use of the $H_2S$ gas. When final devices, according to FIG. 1, were manufactured from substrates heated in twelve percent $H_2S$ gas by volume diluted in nitrogen, efficiencies on the order of twelve percent were achieved.

In another embodiment of the present invention a semiconducting film having increased sulfur content was produced. A substrate according to FIG. 2 was prepared, but the thickness of selenium film 26 was reduced to 5100 angstroms to provide a selenium deficient structure. That is, the atomic ratio of selenium to the composite copper indium film was less than one, in this case about two-thirds. The substrate was then heated or annealed in twelve percent $H_2S$ gas by volume diluted in nitrogen. When the resulting film was used to form a completed device according to FIG. 1, a photovoltaic efficiency of about twelve percent was achieved. We believe that the deficiency of selenium causes incorporation of sufficient sulfur so that a semiconducting film of the class $CuInSe_{2-x}S_x$, where x is less than two, is produced.

In another embodiment of the present invention, other group IIIA elements may be substituted for part of the indium. In particular, gallium and/or aluminum may be used. Two simple techniques are possible for adding these materials according to the present invention. The first is to use an additional separate magnetron sputtering head for each additional element. This works well for aluminum, but is not convenient for gallium. The second technique is to alloy the groups IIIA element with the copper source so that it is deposited with the copper film. This second technique provides a fixed atomic ratio between copper and the group IIIA element or elements. Both techniques provide for easy inclusion of one or more group IIIA elements in addition to indium while retaining control over the copper to indium ratio. Both techniques can be used to make a composite film having a 1:1 atomic ratio of copper to the group IIIA elements.

Substrates according to FIG. 2 were prepared with approximately two atomic percent gallium. After depositing selenium, the substrates were heated in two volume percent $H_2Se$ in nitrogen to form $CuIn_{1-y}Ga_ySe_2$, where y is less than one, (CIGS) films. When these films were used to form completed devices according to FIG. 1, efficiencies on the order to ten percent were achieved. CIGS films yielded better uniformity of performance and a fifteen percent improvement in efficiency compared to CIS films processed simultaneously. Higher concentrations of gallium are possible. Magnetron sputtering targets of fifteen atomic percent gallium in copper have been fabricated to provide higher gallium contents in the final CIGS material by this technique. Annealing Cu/In/(Ga/Al) layers in $H_2$ and $H_2S$ should provide further improvements similar to those found using pure Cu/In layers.

While the present invention has been illustrated and described with reference to particular structures and methods of manufacture, it is apparent that modifications may be made therein within the scope of the appended claims.

What is claimed is:

1. A method for making a semiconducting film comprising:

depositing a composite film of copper and indium onto a substrate, depositing a film of selenium onto the composite copper and indium film, and heating the substrate in the presence of a hydrogen containing gas for a time and at a temperature sufficient to cause interdiffusion of copper, indium and selenium to form a semiconductor of the class $CuInSe_2$.

2. A method according to claim 1 wherein the hydrogen containing gas is a mixture of hydrogen and one or more of argon, nitrogen, and helium.

3. A method according to claim 1 wherein the hydrogen containing gas comprises $H_2Se$.

4. A method according to claim 1 wherein the hydrogen containing gas comprises $H_2S$.

5. A semiconducting thin film formed on a substrate by the method comprising:

depositing a composite film of copper and indium on a substrate, said film having an atomic copper to indium ratio of about one, depositing a film of selenium on said composite copper indium film, said selenium film thickness selected to provide an atomic ratio of selenium to copper and indium of less than one, and heating said substrate with said composite copper indium film and said selenium film in the presence of $H_2S$ gas for a time and at a temperature sufficient to cause interdiffusion of copper, indium, selenium and sulfur to form a semiconductor of the class $CuInSe_{2-x}S_x$ where x is less than two.

6. A method for making a semiconducting film comprising:

depositing onto a substrate a composite film of copper, indium and at least one element selected from the group consisting of gallium and aluminum, depositing a film of selenium onto said composite film, and heating the substrate in the presence of a hydrogen containing gas for a time and at a temperature sufficient to cause interdiffusion of selenium and the elements comprising the composite film.

7. A method according to claim 6 wherein the hydrogen containing gas is a mixture of hydrogen and one or more of argon, nitrogen, and helium.

8. A method according to claim 6 wherein the hydrogen containing gas comprises $H_2Se$.

9. A method according to claim 6 wherein the hydrogen containing gas comprises $H_2S$.

10. A semiconducting thin film formed on a substrate by the method comprising:

depositing onto a substrate a composite film of copper, indium and at least one element selected from the group consisting of gallium and aluminum, said film having an atomic ratio of copper to the other elements of about one, depositing a film of selenium on said composite film, said selenium film thickness selected to provide an atomic ratio of selenium to the elements comprising the composite film of less than one, and heating said substrate with said composite film and said selenium film in the presence of $H_2S$ gas for a time and at a temperature sufficient to cause interdiffusion of selenium, sulfur and the elements comprising the composite film.

* * * * *

UNITED STATES PATENT AND TRADEMARK OFFICE
CERTIFICATE OF CORRECTION

PATENT NO. : 5,045,409

DATED : September 3, 1991

INVENTOR(S) : Eberspacher et al.

It is certified that error appears in the above-identified patent and that said Letters Patent is hereby corrected as shown below:

Title page:

Item (75), Add Gary A. Pollock, Canoga Park, California and David N. Pier, Agoura, California, as inventors.

Signed and Sealed this

Fourth Day of August, 1992

*Attest:*

DOUGLAS B. COMER

*Attesting Officer*      Acting Commissioner of Patents and Trademarks